(12) United States Patent
Itakura

(10) Patent No.: US 9,980,369 B2
(45) Date of Patent: May 22, 2018

(54) MOUNTING BOARD HAVING ELECTRONIC COMPONENTS MOUNTED ON SUBSTRATE USING DIFFERENT SOLDER BALL CONFIGURATIONS

(71) Applicant: JOLED INC., Tokyo (JP)

(72) Inventor: Shunsuke Itakura, Tokyo (JP)

(73) Assignee: JOLED INC., Tokyo (JP)

( * ) Notice: Subject to any disclaimer, the term of this patent is extended or adjusted under 35 U.S.C. 154(b) by 0 days. days.

(21) Appl. No.: 15/630,157

(22) Filed: Jun. 22, 2017

(65) Prior Publication Data

US 2017/0374733 A1    Dec. 28, 2017

(30) Foreign Application Priority Data

Jun. 28, 2016 (JP) ................. 2016-128123

(51) Int. Cl.
| | |
|---|---|
| H05K 1/02 | (2006.01) |
| H01L 23/12 | (2006.01) |
| H01L 23/13 | (2006.01) |
| H01L 25/10 | (2006.01) |
| H01L 27/02 | (2006.01) |
| H01L 23/00 | (2006.01) |

(52) U.S. Cl.
CPC ............ H05K 1/0216 (2013.01); H01L 23/12 (2013.01); H01L 23/13 (2013.01); H01L 25/105 (2013.01); H01L 27/0207 (2013.01); H01L 27/0248 (2013.01); H01L 24/73 (2013.01)

(58) Field of Classification Search
CPC .... H05K 1/0216; H05K 1/02; H01L 27/0248; H01L 27/0207; H01L 23/12; H01L 25/105; H01L 23/13; H01L 24/73; H01L 25/10; H01L 27/02; H01L 23/00
USPC ....... 257/777, 686, 685, 700, 723, 728, 770, 257/774, 738, 737, 734, 778
See application file for complete search history.

(56) References Cited

U.S. PATENT DOCUMENTS 8,525,317 B1 * 9/2013 Sutardja .............. H01L 23/3675
257/685
9,129,935 B1 * 9/2015 Chandrasekar ......... H01L 23/50
(Continued)

FOREIGN PATENT DOCUMENTS

| JP | 2006-147676 | 6/2006 |
| JP | 2008-135772 | 6/2008 |
| JP | 2015-154062 | 8/2015 |

*Primary Examiner* — Alexander Oscar Williams
(74) *Attorney, Agent, or Firm* — Greenblum & Bernstein, P.L.C.

(57) ABSTRACT

A mounting board includes: a first electronic component that includes first solder balls, one of the first solder balls being surrounded by at least three of the first solder balls; a first capacitor that includes a first power supply terminal and a first ground terminal; a second electronic component that includes second solder balls, each of the second solder balls not being surrounded by at least three of the second solder balls; and a second capacitor that includes a second power supply terminal and a second ground terminal. A distance from the first ground terminal to the first electronic component is less than or equal to a distance from the first power supply terminal to the first electronic component. A distance from the second power supply terminal to the second electronic component is less than or equal to a distance from the second ground terminal to the second electronic component.

3 Claims, 5 Drawing Sheets

(56) References Cited

U.S. PATENT DOCUMENTS

| | | | |
|---|---|---|---|
| 2006/0103004 A1 | 5/2006 | Sakai et al. | |
| 2007/0064375 A1* | 3/2007 | Urashima | H01G 2/06 361/311 |
| 2009/0057827 A1* | 3/2009 | Shioga | H01L 23/49822 257/532 |
| 2010/0109052 A1* | 5/2010 | Nakajima | H01L 21/823425 257/197 |
| 2010/0202123 A1* | 8/2010 | Mizuno | H05K 1/0231 361/774 |
| 2011/0031610 A1* | 2/2011 | Yamazaki | H01L 23/4985 257/693 |
| 2015/0237731 A1 | 8/2015 | Toyama et al. | |
| 2017/0033038 A1* | 2/2017 | Nakagawa | H01L 21/56 |

* cited by examiner

MOUNTING BOARD HAVING ELECTRONIC COMPONENTS MOUNTED ON SUBSTRATE USING DIFFERENT SOLDER BALL CONFIGURATIONS

CROSS REFERENCE TO RELATED APPLICATION

The present application is based on and claims priority of Japanese Patent Application No. 2016-128123 filed on Jun. 28, 2016. The entire disclosure of the above-identified application, including the specification, drawings and claims is incorporated herein by reference in its entirety.

FIELD

The present disclosure relates to mounting boards, and particularly to a mounting board on which an electronic component having a plurality of solder balls is mounted.

BACKGROUND

In recent years, mounting boards including a substrate and electronic components such as a semiconductor integrated circuit mounted on the substrate have been used in various electronic devices. For example, electronic components such as an application specific integrated circuit (ASIC) chip have integrated functions and thus have many input/output terminals. In such an electronic component having many input/output terminals, a so-called "ball grid array (BGA)" of many solder balls (solder bumps) is used as a terminal configuration in order to reduce the mounting area. Examples of such an electronic component include electronic components including memories such as a dynamic random access memory (DRAM). Not only data input/output signals but also a reference voltage used in a DRAM is input to such an electronic component. The reference voltage is a direct current (DC) voltage used as a threshold in the DRAM. Therefore, the fluctuation of the reference voltage due to noise or the like causes malfunction of the DRAM. Thus, as a technique of reducing noise contained in the reference voltage, a capacitor is connected between a ground terminal and a terminal of the electronic component to which the reference voltage is input. Here, in many electronic components, grounded solder balls are disposed in the inner part of the array. In this case, if a capacitor is also mounted on the main surface of the substrate on which the electronic component is mounted, the distance between the terminals of the capacitor and the grounded solder balls of the electronic component are long. The line impedance between the capacitor and the electronic component increases as the distance increases, resulting in a decrease in the noise reduction effect of the capacitor.

There has been proposed a technique of mounting a capacitor on a surface of a substrate opposite to a surface thereof on which an electronic component is mounted and connecting the capacitor to the electronic component by a via wiring (see, for example, Patent Literature (PTL) 1). This technique attempts to reduce the distance between the capacitor and the electronic component so as to reduce the line impedance between the capacitor and the electronic component.

CITATION LIST

Patent Literature

[PTL 1] Japanese Unexamined Patent Application Publication No. 2008-155772

SUMMARY

Technical Problem

However, this configuration in which the capacitor is mounted on the bottom surface of the substrate requires a larger space for placing the resulting mounting board. This can prevent application of the mounting board to electronic devices that are required to be smaller and thinner.

On the other hand, when the capacitor is also disposed on the main surface of the substrate on which the electronic component is mounted, the line impedance between the capacitor and the electronic component increases, resulting in a decrease in the noise reduction effect. It is possible to use a plurality of capacitors to increase the noise reduction effect, but the use of a plurality of capacitors requires a larger mounting space, which affects the miniaturization of the mounting board. Furthermore, the use of a plurality of capacitors causes an increase in the cost of the mounting board.

The present disclosure has been made in view of the above problems, and provides a mounting board capable of reducing line impedance between an electronic component and a capacitor and achieving single-sided mounting.

Solution to Problem

In order to achieve the aforementioned object, a mounting board according to an aspect of the present disclosure includes: a substrate; a first electronic component that includes a plurality of first solder balls and is mounted on one main surface of the substrate via the plurality of solder balls, at least one of the plurality of first solder balls being disposed at a position that is surrounded by at least three of the plurality of first solder balls; a first capacitor that includes: a first power supply terminal to which a first direct current voltage is input from a first power supply; and a first ground terminal which is grounded, and is mounted adjacent to the first electronic component on the one main surface of the substrate; a second electronic component that includes a plurality of second solder balls and is mounted on the one main surface of the substrate via the plurality of second solder balls, each of the plurality of second solder balls being disposed at a position that is not surrounded by at least three of the plurality of second solder balls; and a second capacitor that includes: a second power supply terminal to which a second direct current voltage is input from a second power supply; and a second ground terminal which is grounded, and is mounted adjacent to the second electronic component on the one main surface of the substrate. The plurality of first solder balls include: a first ground ball connected to the first ground terminal; and a first power supply ball connected to the first power supply terminal. The plurality of second solder balls include: a second ground ball connected to the second ground terminal; and a second power supply ball connected to the second power supply terminal. A distance from the first ground terminal to the first electronic component is less than or equal to a distance from the first power supply terminal to the first electronic component. A distance from the second power supply terminal to the second electronic component is less than or equal to a distance from the second ground terminal to the second electronic component.

Advantageous Effects

According to the present disclosure, it is possible to provide a mounting board capable of reducing line impedance between an electronic component and a capacitor and achieving single-sided mounting.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS

Hereinafter, embodiments of the present disclosure will be described with reference to the Drawings. It should be noted that each of the embodiments described below shows a specific example of the present disclosure. The numerical values, shapes, materials, structural elements, the arrangement and connection of the structural elements, steps, the order of the steps, etc., shown in the following embodiments are mere examples, and are not intended to limit the scope of the present disclosure. Therefore, among the structural elements in the following embodiments, structural elements not recited in any one of the independent claims which indicate the most generic part of the inventive concept are described as arbitrary structural elements.

It should be noted that the respective figures are schematic illustrations and are not necessarily precise illustrations. Additionally, substantially identical components are assigned the same reference signs, and overlapping description is omitted or simplified.

Embodiment

[Overall Configuration of Mounting Board]

First, the overall configuration of the mounting board according to the present embodiment will be described with reference to the Drawings.

Figure 1:
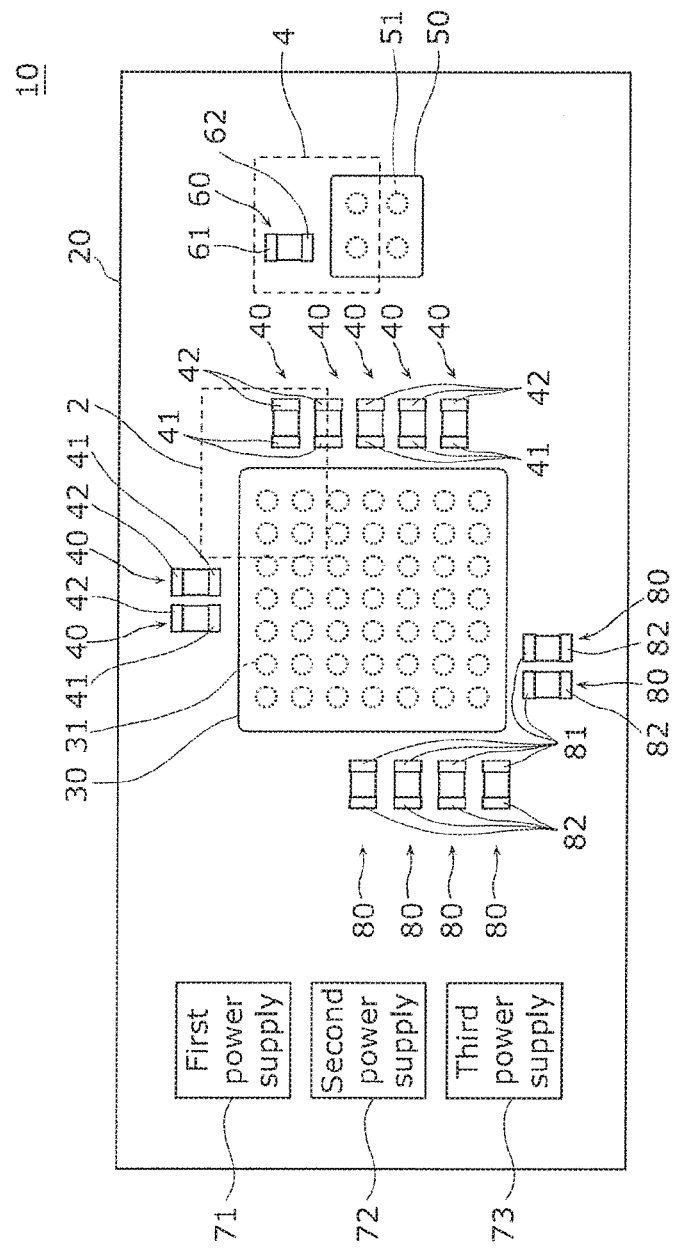
FIG. 1 is a top view showing an overall configuration of a mounting board according to an embodiment.

FIG. 1 is a top view showing the overall configuration of a mounting board 10 according to the present embodiment.

As shown in FIG. 1, the mounting board 10 according to the present embodiment includes a substrate 20, a first electronic component 30, a first capacitor 40, a second electronic component 50, and a second capacitor 60. In the present embodiment, the mounting board 10 further includes a first power supply 71, a second power supply 72, a third power supply 73, and a third capacitor 80.

The mounting board 10 is an electronic module having a predetermined processing function. The processing function of the mounting board 10 is not particularly limited. The mounting board 10 may have an image processing function, for example.

The substrate 20 is a plate-like member on which the first electronic component 30, the first capacitor 40, the second electronic component 50, and the second capacitor 60 are mounted. It should be noted that in the present embodiment, the first power supply 71, the second power supply 72, and the third power supply 73 are further mounted on the substrate 20. In the present embodiment, a multi-layer printed board is used as the substrate 20. However, the structure, material, etc. of the substrate 20 are not particularly limited as long as the above-mentioned electronic components, etc. can be mounted on the substrate 20. The substrate 20 includes a plurality of insulating layers made of an insulating material such as glass epoxy. On each of the plurality of insulating layers, a wiring pattern made of a conductive material such as copper is formed. Furthermore, in the present embodiment, a via wiring is formed through the insulating layer.

The first electronic component 30 is an electronic component that includes a plurality of first solder balls 31 and is mounted on one main surface of the substrate 20 via the plurality of first solder balls 31. The first electronic component 30 includes the plurality of first solder balls 31 on its surface facing the substrate 20. At least one of the plurality of first solder balls 31 of the first electronic component 30 is disposed at a position that is surrounded by at least three of the plurality of first solder balls 31. In other words, the plurality of first solder balls 31 consist of at least three first solder balls 31 disposed in the peripheral portion and at least one first solder ball 31 surrounded by these peripheral first solder balls 31. In the present embodiment, the plurality of first solder balls 31 are arranged in a matrix.

In the present embodiment, the first electronic component 30 is an ASIC having a DRAM. A first direct current (DC) voltage used as a threshold in the DRAM is input to the at least one of the plurality of first solder balls 31 from the first power supply 71. It should be noted that the circuit configuration of the first electronic component 30 is not limited to this. The first electronic component 30 may be, for example, a field-programmable gate array (FPGA), a DRAM, or the like.

The first capacitor 40 is a capacitor that includes a first power supply terminal 42 to which the first DC voltage is input from the first power supply 71 and a first ground terminal 41 which is grounded. The first capacitor 40 is mounted adjacent to the first electronic component 30 on the main surface of the substrate 20 on which the first electronic component 30 is mounted. The first power supply terminal 42 is connected to a first solder ball 31 to which the first DC voltage is input from the first power supply 71, among the plurality of first solder balls 31 of the first electronic component 30. The first ground terminal 41 is connected to a first solder ball 31 which is grounded, among the plurality of first solder balls 31 of the first electronic component 30. Thereby, the first capacitor 40 reduces noise contained in the first DC voltage input to the first electronic component 30 from the first power supply 71. This means that the first capacitor 40 serves as a so-called bypass capacitor.

The first capacitor 40 is not particularly limited as long as it is a capacitor capable of serving as a bypass capacitor. In the present embodiment, the first capacitor 40 is a chip capacitor that includes one first power supply terminal 42 and one first ground terminal 41 and is surface-mounted on the substrate 20.

The second electronic component 50 is an electronic component that includes a plurality of second solder balls 51 and is mounted, via the plurality of second solder balls 51, on the main surface of the substrate 20 on which the first electronic component 30 is mounted. The second electronic component 50 includes the plurality of second solder balls 51 on its surface facing the substrate 20. Each of the plurality of second solder balls 51 of the second electronic component 50 is disposed at a position that is not surrounded by at least three of the plurality of second solder balls 51. In other words, the plurality of second solder balls 51 are arranged in a circular pattern. In the present embodiment, four second solder balls 51 are respectively disposed at positions corresponding to four corners of a rectangle.

In the present embodiment, the second electronic component 50 is a temperature sensor. A second direct current (DC) voltage used in the temperature sensor is input to one of the plurality of second solder balls 51 from the second power supply 72. It should be noted that the circuit configuration of the second electronic component 50 is not limited to this. The second electronic component 50 may be, for example, another type of sensor such as a gyro sensor.

The second capacitor 60 is a capacitor that includes a second power supply terminal 62 to which the second DC voltage is input from the second power supply 72 and a second ground terminal 61 which is grounded. The second capacitor 60 is mounted adjacent to the second electronic component 50 on the main surface of the substrate 20 on which the first electronic component 30 is mounted. The second power supply terminal 62 is connected to a second solder ball 51 to which the second DC voltage is input from the second power supply 72, among the plurality of second solder balls 51 of the second electronic component 50. The second ground terminal 61 is connected to a second solder ball 51 which is grounded, among the plurality of second solder balls 51 of the second electronic component 50. Thereby, the second capacitor 60 reduces noise contained in the second DC voltage input to the second electronic component 50 from the second power supply 72. This means that the second capacitor 60 serves as a bypass capacitor like the first capacitor 40.

The second capacitor 60 is not particularly limited as long as it is a capacitor capable of serving as a bypass capacitor. In the present embodiment, the second capacitor 60 is a chip capacitor that includes one second power supply terminal 62 and one second ground terminal 61 and is surface-mounted on the substrate 20.

The third capacitor 80 is a capacitor that includes a third power supply terminal 82 to which a third direct current (DC) voltage is input from the third power supply 73 and a third ground terminal 81 which is grounded. The third capacitor 80 is mounted adjacent to the first electronic component 30 on the main surface of the substrate 20 on which the first electronic component 30 is mounted. The third power supply terminal 82 is connected to a first solder ball 31 to which the third DC voltage is input from the third power supply 73, among the plurality of first solder balls 31 of the first electronic component 30. The third ground terminal 81 is connected to a first solder ball 31 which is grounded, among the plurality of first solder balls 31 of the first electronic component 30. Thereby, the third capacitor 80 reduces noise contained in the third DC voltage input to the first electronic component 30 from the third power supply 73. This means that the third capacitor 80 serves as a bypass capacitor like the first capacitor 40.

The third capacitor 80 is not particularly limited as long as it is a capacitor capable of serving as a bypass capacitor. In the present embodiment, the third capacitor 80 is a chip capacitor that includes one third power supply terminal 82 and one third ground terminal 81 and is surface-mounted on the substrate 20.

The first power supply 71 is a reference power supply circuit that outputs a first DC voltage to the first electronic component 30. Upon receipt of a voltage input from an external source, the first power supply 71 converts the voltage into a first DC voltage and outputs it. The first power supply 71 also outputs the first DC voltage to the first capacitor 40.

The second power supply 72 is a reference power supply circuit that outputs a second DC voltage to the second electronic component 50. Upon receipt of a voltage input from an external source, the second power supply 72 converts the voltage into a second DC voltage and outputs it. The second power supply 72 also outputs the second DC voltage to the second capacitor 60.

The third power supply 73 is a reference power supply circuit that outputs a third DC voltage to the first electronic component 30. Upon receipt of a voltage input from an external source, the third power supply 73 converts the voltage into a third DC voltage and outputs it. The third power supply 73 also outputs the third DC voltage to the first capacitor 40.

In the present embodiment, the mounting board 10 includes a plurality of first capacitors 40, one second capacitor 60, and a plurality of third capacitors 80, but the numbers of these first to third capacitors are not particularly limited. For example, the mounting board 10 may include one first capacitor 40 and one third capacitor 80, or may include a plurality of second capacitors 60. The mounting board 10 includes three power supplies, i.e., the first power supply 71, the second power supply 72, and the third power supply 73, but the numbers of these first to third power supplies are not particularly limited. For example, the mounting board 10 need not necessarily include a power supply. In this case, the mounting board 10 may be supplied with electric power from an external source. The DC voltages input to respective electronic components and respective capacitors from respective power supplies may be equal to each other. In this case, only one power supply may be used to input a DC voltage to respective electronic components and respective capacitors.

As described above, single-sided mounting is achieved in the mounting board 10 according to the present embodiment.

[Manner of Connection between First Electronic Component and First Capacitor]

The manner of connection between the first electronic component 30 and the first capacitor 40 is described with reference to the Drawings.

Figure 2:
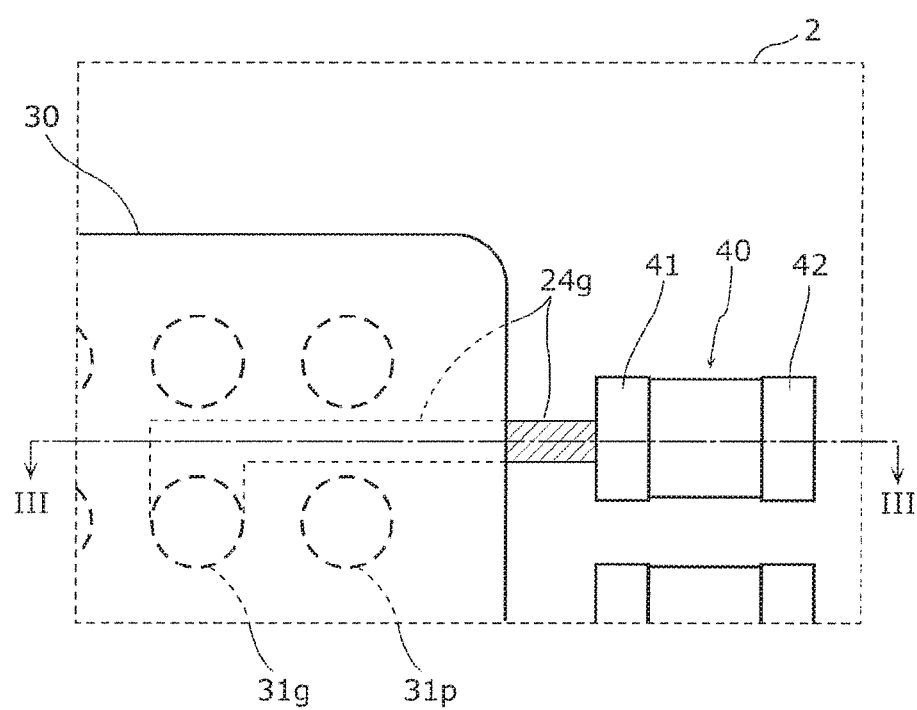
FIG. 2 is an enlarged top view showing a manner of connection between a first electronic component and a first capacitor according to the embodiment.
Figure 3:
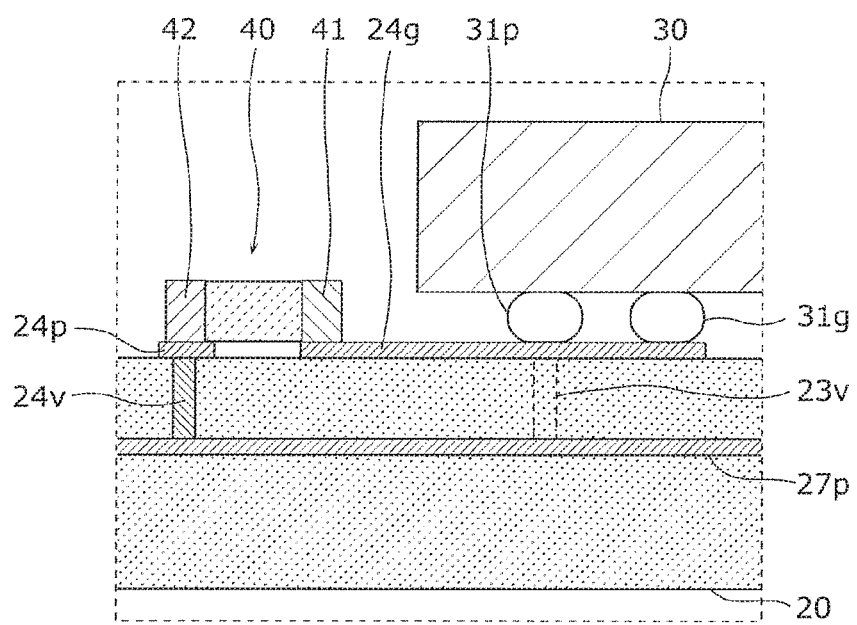
FIG. 3 is a cross-sectional view showing the manner of connection between the first electronic component and the first capacitor according to the embodiment.

FIG. 2 and FIG. 3 are an enlarged top view and an enlarged cross-sectional view, respectively, showing the manner of connection between the first electronic component 30 and the first capacitor 40 according to the present embodiment. FIG. 2 shows an enlarged view of a region 2 surrounded by a dashed line in FIG. 1. FIG. 3 shows a cross section taken along line III-III in FIG. 2.

As shown in FIG. 2 and FIG. 3, the plurality of first solder balls 31 of the first electronic component 30 include: a first ground ball 31g connected to the first ground terminal 41 of the first capacitor 40; and a first power supply ball 31p connected to the first power supply terminal 42 of the first capacitor 40.

Specifically, as shown in FIG. 2 and FIG. 3, the first ground terminal 41 is connected to the first ground ball 31g of the first electronic component 30 via a wiring pattern 24g formed on one main surface of the substrate 20 (the main surface on which the first electronic component 30, etc. are placed).

As shown in FIG. 3, the first power supply terminal 42 is connected to the first power supply ball 31p of the first electronic component 30 via a wiring pattern 24p, a via wiring 24v, a wiring pattern 27p, and a via wiring 23V.

It should be noted that the wiring pattern 24g is grounded via a line not shown. The wiring pattern 27p extends to a position where the first power supply 71 is placed, and thus a first DC voltage is input to the wiring pattern 27p from the first power supply 71.

The wiring patterns 24g and 24p are conductive films disposed on one main surface of the substrate 20 (the main surface on which the first electronic component 30, etc. are placed). The via wiring 24v is a conductive member extending from the wiring pattern 24p in a direction crossing the main surface of the substrate 20 and connected to the wiring pattern 27p. In the present embodiment, the via wiring 24v extends in a direction perpendicular to the main surface of the substrate 20. The wiring pattern 27p is a conductive film disposed within a plane inside the substrate 20. In the present embodiment, the wiring pattern 27p is formed in one of insulating layers stacked in the substrate 20. The via wiring 23v is a conductive member extending from the wiring pattern 27p in a direction crossing the main surface of the substrate 20 and connected to the first power supply ball 31p. In the present embodiment, the via wiring 23v extends in a direction perpendicular to the main surface of the substrate 20. It should be noted that the one main surface of the substrate 20 may further have thereon a wiring pattern that connects the first power supply ball 31p and the via wiring 23v. The substrate 20 may include an electrically insulating film (a resist film) that covers the wiring pattern 24g, etc.

As shown in FIG. 2 and FIG. 3, the distance from the first ground terminal 41 to the first electronic component 30 is less than or equal to the distance from the first power supply terminal 42 to the first electronic component 30. In the present embodiment, the first capacitor 40 is disposed such that the first ground terminal 41 faces the first electronic component 30.

Hereinafter, the advantageous effects of the above-described manner of connection according to the present embodiment will be described.

In conventional electronic components including a plurality of solder balls, in general, solder balls to which a DC voltage is input, like the first power supply ball 31p, are disposed in a peripheral portion of a region where the plurality of solder balls are arranged. Furthermore, other components (such as a bypass capacitor) to which the DC voltage is supplied are disposed near the solder balls to which the DC voltage is input. This configuration is designed to reduce the wiring length between two electronic components, reduce the line impedance therebetween, and thus reduce noise contained in the DC voltage. On the other hand, in most conventional electronic components including a plurality of solder balls, grounded solder balls are disposed in the inner portion (a portion other than the peripheral portion) of a region where the plurality of solder balls are arranged. This configuration is chosen because, in most cases, a ground pattern, which is a grounded wiring pattern, is formed all over the surface of a substrate, and thus the grounded solder balls are connected to the ground pattern and then connected to an external electronic component via the ground pattern.

However, the present inventor has found that in such a manner of connection, the line impedance cannot be reduced sufficiently. In other words, in a conventional mariner of connection, the line impedance between a solder ball to which a DC voltage is applied and an external electronic component is reduced but the line impedance between a grounded solder ball and the external electronic component is not reduced sufficiently. Therefore, in such a conventional manner of connection, noise contained in the DC voltage cannot be reduced sufficiently.

Thus, in the present embodiment, the first capacitor 40 is disposed such that the distance from the first ground terminal 41 to the first electronic component 30 is less than or equal to the distance from the first power supply terminal 42 to the first electronic component 30, as described above. Thereby, the distance from the first ground terminal 41 to the first ground ball 31g of the first electronic component 30 can be reduced, and thus the line impedance between the first ground terminal 41 and the first ground ball 31g can be reduced. Furthermore, in most cases, the first power supply ball 31p is disposed in the peripheral portion of the region where the plurality of first solder balls 31 are arranged, and thus the distance between the first power supply ball 31p and the first power supply terminal 42 is relatively short. Accordingly, the line impedance between the first power supply ball 31p and the first power supply terminal 42 is also relatively small.

As described above, in the present embodiment, the line impedance between the first electronic component 30 and the first capacitor 40 can be reduced, and thus noise contained in the first DC voltage that is input to the first electronic component 30 can be reduced.

Furthermore, in the present embodiment, the first ground terminal 41 and the first ground ball 31g are connected by a wiring structure including, as a shortest connection path in a plane, a portion that is parallel to the one main surface of the substrate 20. Specifically, the wiring pattern 24g, which is a portion parallel to the one main surface of the substrate 20 included in a wiring structure connecting the first ground terminal 41 and the first ground ball 31g, is disposed on the one main surface of the substrate 20 that forms one plane. Furthermore, the wiring pattern 24g is the shortest connection path that connects the first ground terminal 41 and the first ground ball 31g.

Thereby, in the present embodiment, the wiring length connecting the first ground terminal 41 and the first ground ball 31g can be reduced, compared to, for example, a wiring configuration including a plurality of wiring patterns and via wirings formed in a plurality of planes. In addition, the wiring pattern 24g is the shortest connection path that connects the first ground terminal 41 and the first ground ball 31g in a plane (on the one main surface of the substrate 20), and thus the wiring length can be further reduced. It should be noted that the shortest connection path as used herein is not necessarily limited only to a connection path for linearly connecting two specific points. For example, if an obstacle to be avoided, such as another line, is placed between two specific points, the shortest connection path includes a connection path for connecting these two specific points with the shortest possible distance by detouring around the obstacle.

In the present embodiment, the first power supply terminal 42 and the first power supply ball 31p are also connected by a wiring structure including, as a shortest connection path in a plane, a portion that is parallel to the one main surface of the substrate 20. Thereby, the wiring length connecting the first power supply terminal 42 and the first power supply ball 31p can be reduced.

Furthermore, in the present embodiment, the first ground terminal 41 and the first ground ball 31g are connected by the wiring pattern 24g disposed on the one main surface of the substrate 20 (the main surface on which the first electronic component 30, etc. are placed).

Thereby, the length of the wiring pattern and the line impedance can be reduced, compared to a wiring configuration in which the wiring pattern is disposed inside the substrate 20. Accordingly, noise contained in the first DC voltage that is input to the first electronic component 30 can be further reduced.

It should be noted that, in the present embodiment, the manner of connection between the first electronic component 30 and the third capacitor 80 is the same as the manner of connection between the first electronic component 30 and the first capacitor 40. With this configuration, the line impedance between the first electronic component 30 and the third capacitor 80 can be reduced, and thus noise contained in the third DC voltage that is input to the first electronic component 30 can be reduced.

[Manner of Connection between Second Electronic Component and Second Capacitor]

The manner of connection between the second electronic component 50 and the second capacitor 60 is described with reference to the Drawings.

Figure 4:
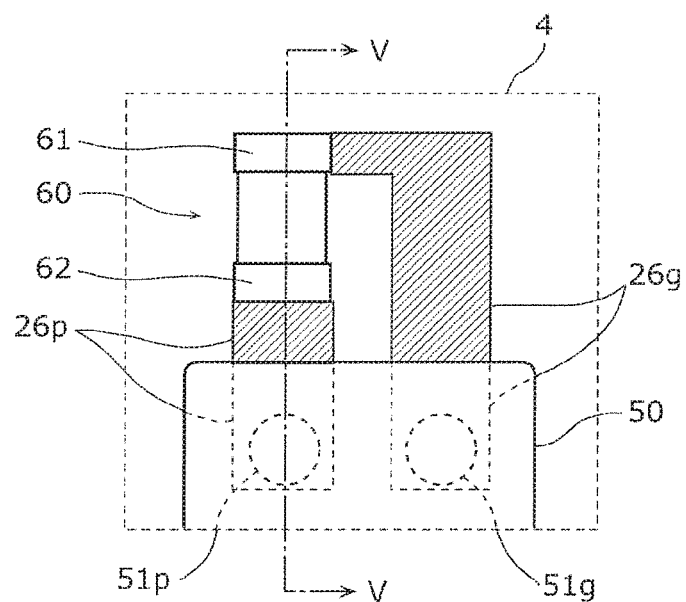
FIG. 4 is an enlarged top view showing a manner of connection between a second electronic component and a second capacitor according to the embodiment.
Figure 5:
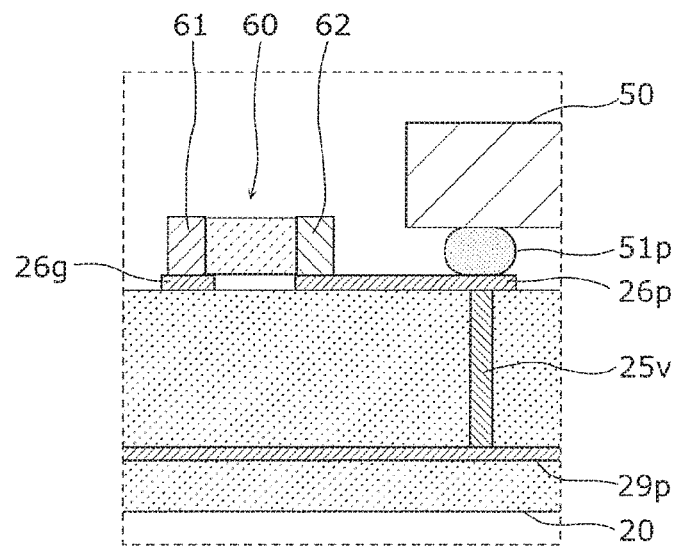
FIG. 5 is a cross-sectional view showing the manner of connection between the second electronic component and the second capacitor according to the embodiment.

FIG. 4 and FIG. 5 are an enlarged top view and an enlarged cross-sectional view, respectively, showing the manner of connection between the second electronic component 50 and the second capacitor 60 according to the present embodiment. FIG. 4 shows an enlarged view of a region 4 surrounded by a dashed line in FIG. 1. FIG. 5 shows a cross section taken along line V-V in FIG. 4.

As shown in FIG. 4 and FIG. 5, the plurality of second solder balls 51 of the second electronic component 50 include a second ground ball 51g connected to the second ground terminal 61 of the second capacitor 60 and a second power supply ball 51p connected to the second power supply terminal 62 of the second capacitor 60.

Specifically, as shown in FIG. 4, the second ground terminal 61 is connected to the second ground ball 51g of the second electronic component 50 via a wiring pattern 26g disposed on the one main surface of the substrate 20 (the main surface on which the second electronic component 50, etc. are placed).

As shown in FIG. 4 and FIG. 5, the second power supply terminal 62 is connected to the second power supply ball 51p of the second electronic component 50 via a wiring pattern 26p.

It should be noted that the wiring pattern 26g is grounded via a line not shown. The wiring pattern 26p extends, via a via wiring 25v and a wiring pattern 29p, to a position where the second power supply 72 is disposed, and a second DC voltage is input to the wiring pattern 26p from the second power supply 72.

The wiring patterns 26g and 26p are conductive films disposed on the one main surface of the substrate 20 (the main surface on which the second electronic component 50, etc. are placed). The via wiring 25v is a conductive member extending from the wiring pattern 26p in a direction crossing the main surface of the substrate 20 and connected to the wiring pattern 29p. in the present embodiment, the via wiring 25v extends in a direction perpendicular to the main surface of the substrate 20. The wiring pattern 29p is a conductive film disposed within a plane inside the substrate 20. In the present embodiment, the wiring pattern 29p is formed in one of a plurality of insulating layers stacked in the substrate 20.

As shown in FIG. 4 and FIG. 5, the distance from the second power supply terminal 62 to the second electronic component 50 is less than or equal to the distance from the second ground terminal 61 to the second electronic component 50. In the present embodiment, the second capacitor 60 is disposed such that the second power supply terminal 62 faces the second electronic component 50.

Hereinafter, the advantageous effects of the above manner of connection according to the present embodiment will be described.

Each of the plurality of second solder balls 51 of the second electronic component 50 according to the present embodiment is disposed at a position that is not surrounded by at least three of the plurality of second solder balls 51. In other words, all the second solder balls 51 are arranged in a peripheral portion of a region where the plurality of second solder balls 51 are arranged. This means that the second solder ball 51g and the second power supply ball 51p included in the plurality of second solder balls 51 are also disposed in the peripheral portion. This arrangement makes it possible to locate the second ground ball 51g of the second electronic component 50 and the second ground terminal 61 of the second capacitor 60 disposed adjacent to the second electronic component 50 at a relatively short distance from each other, as well as to locate the second power source ball 51p of the second electronic component 50 c and the second power supply terminal 62 of the second capacitor 60 at a relatively short distance from each other. Thus, unlike the above-described manner of connection between the first electronic component 30 and the first capacitor 40, in the manner of connection between the second electronic component 50 and the second capacitor 60, the second capacitor 60 is disposed such that the distance from the second power supply terminal 62 to the second electronic component 50 is less than or equal to the distance from the second ground terminal 61 to the second electronic component 50.

Thereby, the distance between the second power supply ball 51p to which a second DC voltage is input and the second power supply terminal 62 can be reduced, and thus the line impedance between the second power supply ball 51p and the second power supply terminal 62 can be reduced. Accordingly, noise contained in the second DC voltage that is input to the second electronic component 50 can be reduced more effectively. In addition, since the second ground ball 51g is disposed in the peripheral portion of the region where the second solder balls 51 are arranged, the distance between the second ground ball 51g and the second ground terminal 61 is also relatively short. Therefore, in the present embodiment, the line impedance between the second ground ball 51g and the second ground terminal 61 also can be reduced to a relatively low level. Accordingly, an increase in noise contained in the second DC voltage that is input to the second electronic component 50 can be reduced.

As described above, in the present embodiment, the line impedance between the second electronic component 50 and the second capacitor 60 can be reduced, and thus noise contained in the second DC voltage that is input to the second electronic component 50 can be reduced.

[Conclusion]

As described above, the mounting board 10 according to the present embodiment includes: a substrate 20; a first electronic component 30; and a first capacitor 40. The first electronic component 30 includes a plurality of first solder balls 31 and is mounted on one main surface of the substrate 20 via the plurality of solder balls 31. At least one of the plurality of first solder balls 31 is disposed at a position that is surrounded by at least three of the plurality of first solder balls 31. The first capacitor 40 includes: a first power supply terminal 42 to which a first direct current voltage is input from a first power supply 71; and a first ground terminal 41 which is grounded, and is mounted adjacent to the first electronic component 30 on the one main surface of the substrate 20. The mounting board 10 further includes: a second electronic component 50; and a second capacitor 60. The second electronic component 50 includes a plurality of second solder balls 51 and is mounted on the one main surface of the substrate 20 via the plurality of second solder balls 51. Each of the plurality of second solder balls 51 is disposed at a position that is not surrounded by at least three of the plurality of second solder balls 51. The second capacitor 60 includes: a second power supply terminal 62 to which a second direct current voltage is input from a second power supply 72; and a second ground terminal 61 which is grounded, and is mounted adjacent to the second electronic component 50 on the one main surface of the substrate 20. The plurality of first solder balls 31 include: a first ground ball 31g connected to the first ground terminal 41; and a first power supply ball 31p connected to the first power supply terminal 42. The plurality of second solder balls 51 include: a second ground ball 51g connected to the second ground terminal 61; and a second power supply ball 51p connected to the second power supply terminal 62. The distance from the first ground terminal 41 to the first electronic component 30 is less than or equal to the distance from the first power supply terminal 42 to the first electronic component 30. The distance from the second power supply terminal 62 to the second electronic component 50 is less than or equal to the distance from the second ground terminal 61 to the second electronic component 50.

With this configuration, the distance from the first ground terminal 41 to the first ground ball 31g of the first electronic component 30 can he reduced, and thus the line impedance between the first around terminal 41 and the first ground ball 31g can be reduced. Furthermore, in most cases, the first power supply ball 31p is disposed in the peripheral portion of the region where the plurality of first solder balls 31 are arranged, and thus the distance between the first power supply ball 31p and the first power supply terminal 42 is relatively short. Accordingly, the line impedance between the first power supply ball 31p and the first power supply terminal 42 is also relatively low. Accordingly, noise contained in the first DC voltage that is input to the first electronic component 30 can be reduced. Furthermore, the distance between the second power supply ball 51p to which a second DC voltage is input and the second power supply terminal 62 can be reduced, and thus the line impedance between the second power supply ball 51p and the second power supply terminal 62 can be reduced. Accordingly, noise contained in the second DC voltage that is input to the second electronic component 50 can be reduced more effectively. In addition, since the second ground ball 51g is disposed in the peripheral portion of the region where the second solder balls 51 are arranged, the distance between the second ground ball 51g and the second ground terminal 61 is also relatively short. Therefore, in the present embodiment, the line impedance between the second ground ball 51g and the second ground terminal 61 also can be reduced to a relatively low level. Accordingly, an increase in noise contained in the second DC voltage that is input to the second electronic component 50 can be reduced.

In addition, in the mounting board 10, the advantageous effects mentioned above can be achieved by single-sided mounting on the substrate 20. Therefore, a much smaller and thinner mounting board can be obtained.

Furthermore, the first ground terminal 41 and the first ground ball 31g may be connected by a wiring structure including, as a shortest connection path in a plane, a portion that is parallel to the one main surface of the substrate 20.

Thereby, the wiring length between the first ground terminal 41 and the first ground ball 31g can be further reduced. With this configuration, the line impedance between the first ground terminal 41 and the first ground ball 31g can be reduced, and thus noise contained in the first DC voltage that is input to the first electronic component 30 car be further reduced.

Furthermore, in the mounting board 10, the first ground terminal 41 and the first ground ball 31g are connected by the wiring pattern 24g that is disposed on the one main surface of the substrate 20.

Thereby, the wiring length of the wiring pattern and the line impedance can be reduced, compared to a wiring configuration in which the wiring pattern is disposed inside the substrate 20. Accordingly, noise contained in the first DC voltage that is input to the first electronic component 30 can be further reduced.

Other Embodiments

Although the mounting board according to the present disclosure has been described based on the embodiment, the mounting board according to the present disclosure is not limited the above-described embodiment. Other embodiments realized by arbitrarily combining structural elements in the embodiment, variations arrived at by those skilled in the art by making various modifications to the embodiment within the scope of the present disclosure, and various devices having therein the mounting board according to the present embodiment are also included in the present disclosure.

For example, in the embodiment described above, two-terminal chip capacitors are used as the first capacitor 40, the second capacitor 60, and the third capacitor 80, but each of these capacitors is not limited to this type of capacitor. For example, a multi-terminal chip capacitor or the like may be used. Hereinafter, an example of the use of a multi-terminal chip capacitor will be described with reference to the Drawing.

Figure 6:
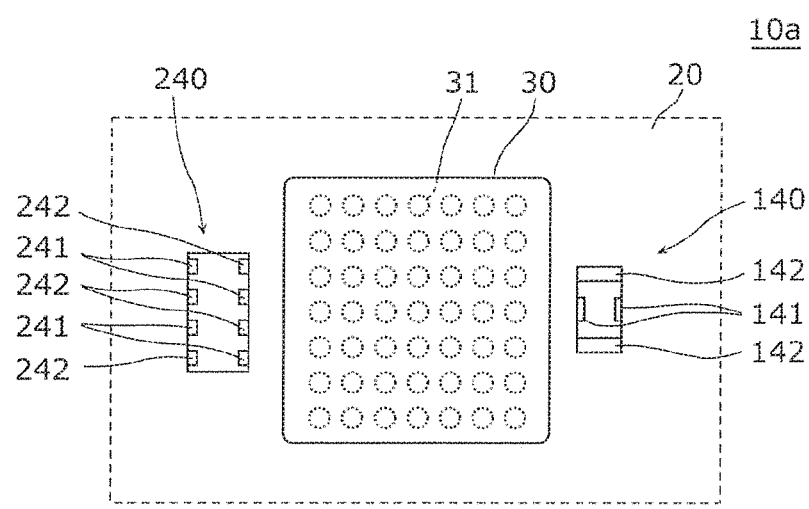
FIG. 6 is a top view showing a configuration of the first electronic component and its surroundings on a mounting board according to a variation.

FIG. 6 is a top view showing a configuration of the first electronic component 30 and its surroundings on a mounting board 10a according to a variation.

As shown in FIG. 6, the mounting board 10a according to this variation includes: a first capacitor 140, which is a four-terminal chip capacitor; and a first capacitor 240, which is an eight-terminal chip capacitor. These first capacitors 140 and 240 are both mounted adjacent to the first electronic component 30.

The first capacitor 140 includes: two first power supply terminals 142 to which a first DC voltage is input from the first power supply 71; and two first ground terminals 141 which are grounded. The first capacitor 240 includes: four first power supply terminals 242 to which a first DC voltage is input from the first power supply 71; and four first ground terminals 241 which are grounded.

Also in this variation, the distances from the first ground terminals 141 and 241 to the first electronic component 30 are respectively less than or equal to the distances from the first power supply terminals 142 and 242 to the first electronic component 30. In the case where the first capacitor 140 includes a plurality of first ground terminals 141 and the first capacitor 240 includes a plurality of first ground terminals 241, as in this variation, it is only necessary that the distances from at least half of the plurality of ground terminals 141 to the first electronic component 30 be less than or equal to the distance from the first power supply terminal 142 to the first electronic component 30 and that the distances from at least half of the plurality of ground terminals 241 to the first electronic component 30 be less than or equal to the distance from the first power supply terminal 242 to the first electronic component 30.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is useful for electronic devices including a mounting board on which electronic components such as a semiconductor integrated circuit are mounted. The present disclosure is best suited particularly for use in electronic devices such as a display device that are required to be smaller and thinner.

The invention claimed is:

1. A mounting board, comprising:
   a substrate;
   a first electronic component that includes a plurality of first solder balls and is mounted on one main surface of the substrate via the plurality of first solder balls, at least one of the plurality of first solder balls that is not located in a peripheral portion of the first electronic component being disposed at a position that is surrounded by at least three of the plurality of first solder balls that are located in the peripheral portion of the first electronic component;
   a first capacitor that includes: a first power supply terminal to which a first direct current voltage is input from a first power supply; and a first ground terminal which is grounded, and is mounted adjacent to the first electronic component on the one main surface of the substrate;
   a second electronic component that includes a plurality of second solder balls and is mounted on the one main surface of the substrate via the plurality of second solder balls that are located in a peripheral portion of the second electronic component, each of the plurality of second solder balls being disposed at a position that is not located in an interior portion of the second electronic component that is surrounded by at least three of the plurality of second solder balls; and
   a second capacitor that includes: a second power supply terminal to which a second direct current voltage is input from a second power supply; and a second ground terminal which is grounded, and is mounted adjacent to the second electronic component on the one main surface of the substrate,
   wherein the plurality of first solder balls include: a first ground ball connected to the first ground terminal; and a first power supply ball connected to the first power supply terminal,
   the plurality of second solder balls include: a second ground ball connected to the second ground terminal; and a second power supply ball connected to the second power supply terminal,
   a distance from the first ground terminal to the first electronic component is less than or equal to a distance from the first power supply terminal to the first electronic component, and
   a distance from the second power supply terminal to the second electronic component is less than or equal to a distance from the second ground terminal to the second electronic component.

2. The mounting board according to claim 1, wherein the first ground terminal and the first ground ball are connected by a wiring structure including, as a shortest connection path in a plane, a portion that is parallel to the one main surface of the substrate.

3. The mounting board according to claim 2, wherein the first ground terminal and the first ground ball are connected by a wiring pattern that is disposed on the one main surface of the substrate.

* * * * *